United States Patent
Shibasaki et al.

(10) Patent No.: US 9,287,883 B2
(45) Date of Patent: Mar. 15, 2016

(54) MULTI-LANE RE-TIMER CIRCUIT AND MULTI-LANE RECEPTION SYSTEM

(71) Applicant: FUJITSU LIMITED, Kawasaki-shi, Kanagawa (JP)

(72) Inventors: Takayuki Shibasaki, Kawasaki (JP); Yukito Tsunoda, Isehara (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 14/525,957

(22) Filed: Oct. 28, 2014

(65) Prior Publication Data
US 2015/0200768 A1  Jul. 16, 2015

(30) Foreign Application Priority Data

Jan. 14, 2014  (JP) .................................. 2014-004203

(51) Int. Cl.
| | |
|---|---|
| H04L 27/06 | (2006.01) |
| H03L 7/00 | (2006.01) |
| H04L 7/033 | (2006.01) |
| H04L 25/14 | (2006.01) |
| H04L 7/00 | (2006.01) |

(52) U.S. Cl.
CPC ................ H03L 7/00 (2013.01); H04L 7/0083 (2013.01); H04L 7/033 (2013.01); H04L 25/14 (2013.01); *H04L 7/0025* (2013.01)

(58) Field of Classification Search
CPC ......... H04L 7/0008; H04L 7/02; H04L 7/033; H04L 7/04; H04L 7/0337; H04L 7/0896; H04L 7/087; H04L 7/0891
USPC .................. 375/354, 362, 373–376
See application file for complete search history.

(56) References Cited

U.S. PATENT DOCUMENTS

| | | | |
|---|---|---|---|
| 6,836,522 B1 | 12/2004 | Wakayama | |
| 2005/0007966 A1* | 1/2005 | Chang | 370/282 |
| 2006/0215296 A1* | 9/2006 | Latchman | 360/51 |
| 2011/0298505 A1* | 12/2011 | Khoury et al. | 327/156 |
| 2013/0108001 A1* | 5/2013 | Chang et al. | 375/374 |

FOREIGN PATENT DOCUMENTS

| | | |
|---|---|---|
| JP | 58-121847 A | 7/1983 |
| JP | 2001-119382 A | 4/2001 |

OTHER PUBLICATIONS

Jinho Han et al., "0.6-2.7-Gb/s Referenceless Parallel CDR With a Stochastic Dispersion-Tolerant Frequency Acquisition Technique", IEEE trans. on VLSI Systems (Early access article), 2013, pp. 1-7.

* cited by examiner

*Primary Examiner* — Dac Ha
*Assistant Examiner* — Janice Tieu
(74) *Attorney, Agent, or Firm* — Arent Fox LLP (57) ABSTRACT

A multi-lane re-timer circuit includes: a clock generation circuit to generate a base clock; and reception circuits to generate a reception clock and receive input data signals from lanes, wherein each of the reception circuits includes: a phase frequency detector to generate phase difference signal and frequency difference signal between the input data signal and the reception clock; a clock data regeneration controller to generate a control signal based on the phase difference signal; a phase rotator to generate the reception clock from the base clock; and a decision circuit to receive the input data signal, and wherein the clock generation circuit includes: an input selector to select a signal; a charge pump to generate a charge signal; a loop filter to remove a high frequency component from the charge signal to output a voltage control signal; and a voltage controlled oscillator to generate the reception clock.

8 Claims, 11 Drawing Sheets

MULTI-LANE RE-TIMER CIRCUIT AND MULTI-LANE RECEPTION SYSTEM

CROSS-REFERENCE TO RELATED APPLICATION

This application is based upon and claims the benefit of priority from the prior Japanese Patent Application No. 2014-004203 filed on Jan. 14, 2014, the entire contents of which are incorporated herein by reference.

FIELD

The embodiments discussed herein are related to a multi-lane re-timer circuit and a multi-lane reception system.

BACKGROUND

As the performance of the core communication devices or signal processing equipments such as a server is being improved, a data rate of a signal transmission/reception is required to be increased inside and outside of a device, for example, within an integrated circuit chip or between integrated circuit chips (intra-device or inter-device). For example, the data rate may be a bit rate in a high-speed I/O application in which signals are transmitted/received.

A related technology is disclosed in Non-Patent Document 1 of J. Han, et al., "0.6-2.7-Gb/s Referenceless Parallel CDR With a Stochastic Dispersion-Tolerant Frequency Acquisition Technique", IEEE Trans. on VLSI Systems (Early access article), 2013.

SUMMARY

According to one aspect of the embodiment, a multi-lane re-timer circuit includes: a clock generation circuit configured to generate a base clock; and a plurality of reception circuits configured to generate a reception clock based on the base clock and receive input data signals from a plurality of lanes according to the reception clock, wherein each of the plurality of the reception circuits includes: a phase frequency detector configured to detect a phase difference and a frequency difference between the input data signal and the reception clock, and generate phase difference signal and frequency difference signal; a clock data regeneration controller configured to generate a control signal based on the phase difference signal; a phase rotator configured to generate the reception clock from the base clock according to the control signal; and a decision circuit configured to receive the input data signal according to the reception clock, and wherein the clock generation circuit includes: an input selector configured to select a signal to be used from pieces of the frequency difference signal output by phase frequency detectors of the plurality of the reception circuits; a charge pump configured to generate a charge signal according to selection signal selected by the input selector; a loop filter configured to remove a high frequency component from the charge signal to output a voltage control signal; and a voltage controlled oscillator configured to generate the reception clock according to the voltage control signal.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

At a reception circuit, a transmitted data is decided at an adequate timing and data and clock are recovered by being subjected to a CDR (Clock and Data Recovery). The CDR is performed in such a way that a phase difference and a frequency difference between an input data and a reception (sampling) clock is detected and a phase adjustment of the sampling clock is performed based on signal of the frequency difference. A re-timer circuit of the reception circuit outputs data which is re-timed and of which jitter is reduced by the clock recovered from the input data without using a reference clock.

In the re-timer circuit, a phase frequency detector (PFD) detects the phase difference and the frequency difference between the input data and the sampling clock, and outputs phase difference signal and frequency difference signal. A charge pump (CP) performs an addition/subtraction of electric current for a loop filter (LPF) according to the phase difference signal and the frequency difference signal to generate a control voltage. A voltage-controlled-oscillator (VCO) changes an oscillation frequency according to the control voltage and outputs the changed oscillation frequency as a sampling clock. The sampling clock generated by the re-timer circuit is supplied to a decision circuit. The decision circuit receives an input data according to a sampling clock of which timing is adjusted for the input data.

For example, data is transmitted at a high speed using the re-timer circuit in the multi-lane transmission system in which data are transmitted over a plurality of lanes. A plurality of transmission circuits of a transmission side in the multi-lane transmission system outputs data to the plurality of the transmission lanes according to a common transmission clock. When the re-timer circuit is employed in a multi-lane system, the re-timer circuit may be used in each of the plurality of the reception circuits, but a circuit size may become larger. For example, a high frequency VCO of the re-timer circuit includes an inductor. When a plurality of the VCOs are used, the plurality of the VCOs are arranged to be separated in order to prevent the interaction between the inductors. As a result, the circuit size becomes larger, and the VCOs may be shared.

For example, a single clock generation circuit including the VCO, and a charge pump and a loop filter for controlling the VCO, is used in a plurality of reception circuits so as to be shared by the plurality of reception circuits. The frequency difference signal generated by one of phase frequency detectors used in the plurality of the reception circuits is supplied to the clock generation circuit. The clock generation circuit generates a base clock according to the frequency of the input data and supplies the base clock to the plurality of reception circuits. The transmission clock is a commonly used clock and the input data from the plurality of lanes varies according to the common clock, and the phase of the input data is different for each lane.

The phase frequency detector of each reception circuit compares the input data with the reception clock and generates the phase difference signal and the frequency difference signal. The charge pump and the loop filter generate a detection signal according to the phase difference signal and the frequency difference signal. The controller generates a control signal for controlling a phase interpolation circuit (phase interpolator) which changes the phase of the base clock according to the detection signal. The phase interpolator generates the reception clock aligned to the input data received by each reception circuit according to the control signal.

Figure 1:
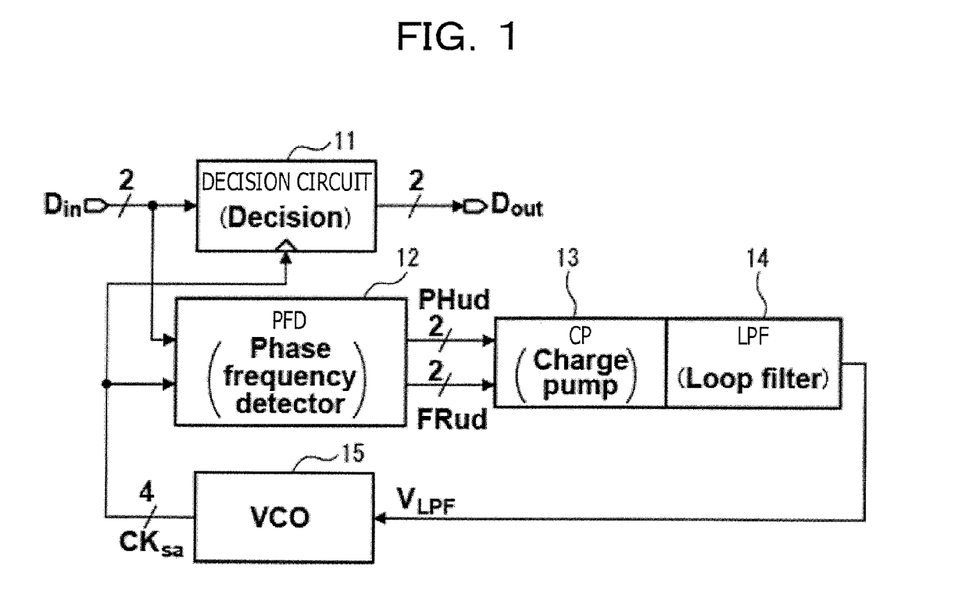
FIG. 1 is a view illustrating an example of a re-timer circuit of a single-lane configuration.

An abnormality of the data input to a specific lane may occur due to a fault occurred in any part in a transmission system. In the multi-lane re-timer circuit, when the lane over which the frequency signal is transmitted to the VCO fails, the frequency synchronization may be disabled and all the lanes may not operate. FIG. 1 is a view illustrating an example of a re-timer circuit of a single-lane configuration.

The re-timer circuit includes a decision circuit (Decision) 11, a phase frequency detector (PFD) 12, a charge pump (CP) 13, a loop filter (LPF) 14, a voltage controlled oscillator (VCO) 15.

The decision circuit 11 decides whether the input data $D_{in}$ is 0 (zero) or 1 (one) at a timing of the recovered sampling clock $CK_{sa}$ and outputs the decision result as an output data $D_{out}$. The phase frequency detector 12 detects the phase difference and the frequency difference between the input data $D_{in}$ and the sampling clock $CK_{sa}$ and outputs the phase difference signal $PH_{ud}$ and the frequency difference signal $FR_{ud}$. The charge pump 13 controls the addition/subtraction of electric current in the LPF 14 according to the phase difference signal $PH_{ud}$ and the frequency difference signal $FR_{ud}$. The loop filter 14 outputs a control voltage $V_{LPF}$ which is a result of the addition/subtraction of electric current. The VCO 15 outputs a sampling clock $CK_{sa}$ which is obtained by changing an oscillation frequency according to the control voltage $V_{LPF}$. In FIG. 1, the number of phases of the sampling clock is four phases, but the number of phases may include two phases or vary according to, for example, a configuration of the PFD 12. The input data and the sampling clock are synchronized with each other, and a data decision may be performed at an accurate timing.

Figure 2:
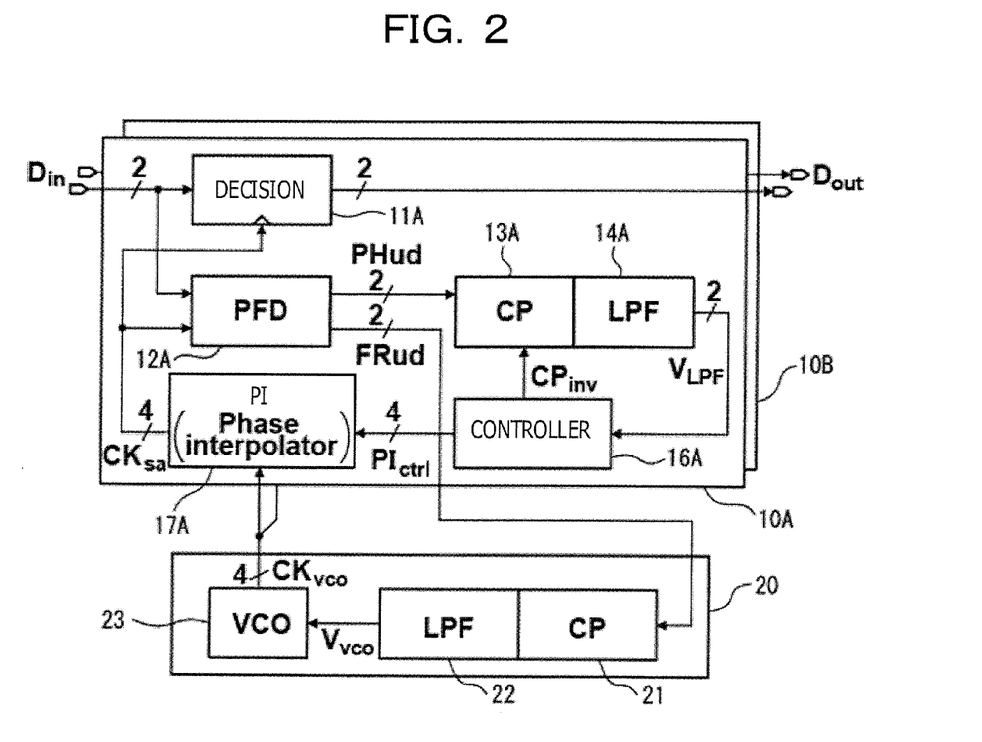
FIG. 2 is a view illustrating an example of a re-timer circuit of a plurality of reception circuits of a multi-lane transmission system.

FIG. 2 illustrates an example of a re-timer circuit of a plurality of reception circuits of a multi-lane transmission system. In FIG. 2, a two-lane configuration is illustrated, but a three or more-lane configuration may also be substantially the same as or similar to the configuration illustrated in FIG. 2.

A reception side includes a plurality of (e.g., two in FIG. 2) reception circuits 10A and 10B and a clock generation circuit 20. A single clock generation circuit 20 may be shared by the plurality of the reception circuits.

The reception circuit 10A includes a decision circuit 11A, a phase frequency detector (PFD) 12A, a charge pump (CP) 13A, a loop filter (LPF) 14A, a controller 16A and a phase interpolator (PI) 17A. The reception circuit 10B may also have a configuration substantially the same as or similar to that of the reception circuit 10A. In the following, the reception circuit 10A will be described. The decision circuit 11A and the phase frequency detector 12A may be substantially the same as or similar to the corresponding elements illustrated in FIG. 1. The charge pump 13A receives a phase difference signal $PH_{ud}$ from the phase frequency detector 12A and controls the addition/subtraction of electric current in the loop filter 14 according to the phase difference signal $PH_{ud}$. For example, the charge pump 13A may not receive a frequency difference signal $FR_{ud}$ output by the phase frequency detector 12A.

The controller 16A outputs a voltage or current signal $PI_{ctrl}$ for controlling the phase interpolator 17A based on the output $V_{LPF}$ of the LPF 14A. The phase interpolator 17A changes an electric current ratio to be used for interpolation according to the $PI_{ctrl}$ so as to perform the phase shift of the sampling clock $CK_{sa}$ supplied from the clock generation circuit 20. The controller 16A detects the switching of the interpolated phase between quadrants (0 degree, 90 degrees, 180 degrees, 270 degrees) in order to change the phase in a cyclic fashion and outputs a polarity inversion signal $CP_{inv}$ to the charge pump 13A.

The clock generation circuit 20 includes a charge pump (CP) 21, a loop filter (LPF) 22 and a voltage controlled oscillator (VCO) 23.

The charge pump 21 of the clock generation circuit 20 receives the frequency difference signal $FR_{ud}$ from the phase frequency detector 12A of one of the plurality of the reception circuits (here, the reception circuit 10A) and controls the addition/subtraction of electric current of the loop filter 22. The loop filter 22 outputs the control voltage $V_{VCO}$ which is a result of the addition/subtraction of electric current. The VCO 23 outputs the output (base) clock $CK_{VCO}$ obtained by changing the oscillation frequency according to the control voltage $V_{VCO}$ and the base clock $CK_{VCO}$ is distributed to each of the reception circuits 10A and 10B.

In the multi-lane transmission system, a plurality of transmission circuits of the transmission side output the transmission data according to a common transmission clock output by a single oscillator. Therefore, the input data received by the plurality of the reception circuits 10A and 10B have substantially the same frequency. Phases of the input data may be different at each lane (reception circuit). With the configuration described above, the VCO 23 oscillates at a frequency which is substantially the same as a frequency of the input data or a frequency obtained by multiplied the frequency of the input data by an integer number. In each lane, the phase interpolator may synchronize the phase to the input data so as to perform the data decision at an accurate timing. As described above, the frequencies of the input data received by the plurality of the reception circuits 10A and 10B are substantially the same and the control of the oscillation frequency of the VCO 23 in the clock generation circuit 20 may be performed based on the frequency difference signal $FR_{ud}$ from one of the plurality of the reception circuits. Each reception circuit may perform only the phase adjustment. The charge pump 13A of each reception circuit may control the addition/subtraction of electric current in the loop filter 14 according to the phase difference signal $PH_{ud}$ output by the phase frequency detector 12A, for example, according to only the phase difference signal $PH_{ud}$.

Figure 3:
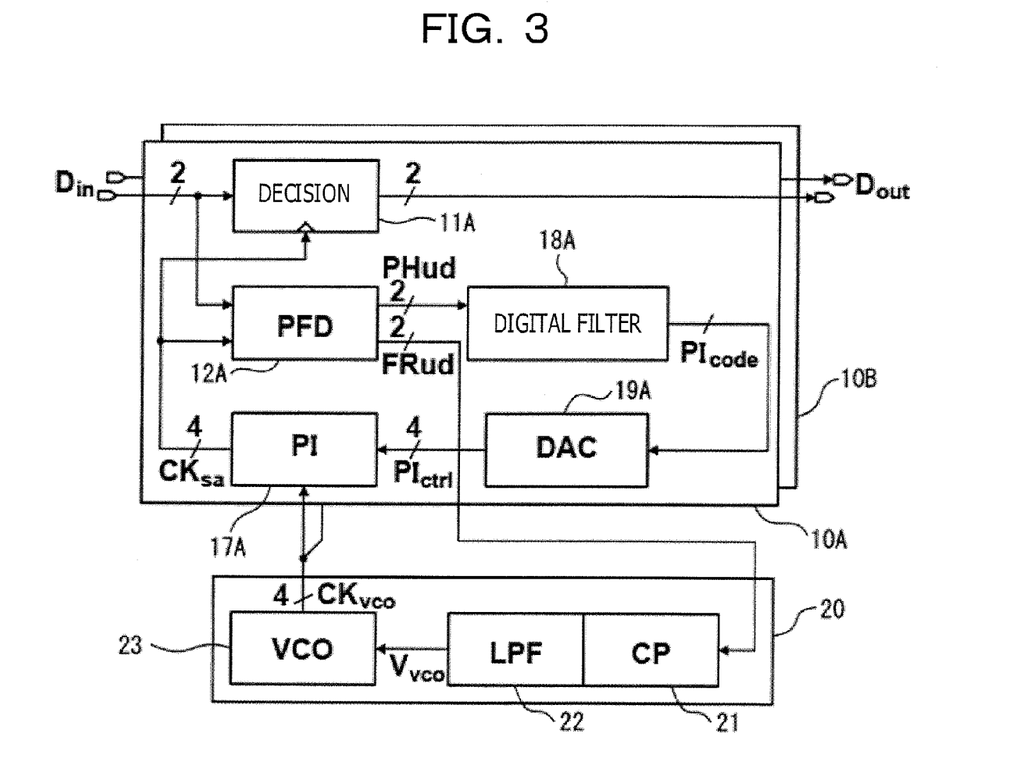
FIG. 3 is a view illustrating another example of a re-timer circuit of a plurality of reception circuits of the multi-lane transmission system.

FIG. 3 is a view illustrating another example of a re-timer circuit of a plurality of reception circuits of a multi-lane transmission system.

The re-timer circuit of FIG. 3 is different from that of FIG. 2 in that the charge pump 13A and the loop filter 14A is replaced by a digital filter 18A and the controller 16A is replaced by a DAC (Digital to analog converter) 19A. For example, an analog circuit is utilized in FIG. 2 and a digital circuit is utilized in FIG. 3 as a loop part which controls the phase interpolator 17A. Hereinafter, descriptions will be made on different parts of the re-timer circuit. The digital filter 18A generates a phase code $PI_{code}$ of the phase interpolator 17A according to the phase difference signal $PH_{ud}$ from the phase frequency detector 12A. The DAC 19A generates $PI_{ctrl}$ which is an analog signal for controlling the phase interpolator 17A from the $PI_{code}$.

An abnormality of the data input to a specific lane may occur due to a fault occurred in any part in the transmission system. For example, when the reception circuit or the lane which sends the frequency difference signal $FR_{ud}$ to the clock generation circuit 20 is failed, the frequency synchronization may not be carried out and all the lanes may not operate.

In the VCO 23, the frequency of the base clock $CK_{VCO}$ is synchronized to the input data. For example, since there exists a frequency offset which is a slight deviation between the base clock $CK_{VCO}$ and the input data, the phase interpolator 17A of each lane may continuously perform the phase shift in order to compensate for the frequency offset. The phase interpolator 17A sets a clock adjacent to the base clock having four phases to perform the phase interpolation. Since there is a difference in gain-up and gain-down, the relationship of the clock phase to be actually output with respect to a clock phase which is set may vary depending on the settings, and, for example, the linearity may not be good. Since the phase shift is continuously performed to make the phase difference zero by the phase interpolation, the phase slowly rotates to cause the phase to be combined to vary. Therefore, the characteristic of the linearity of the phase interpolator 17A is reflected in the output and thus, the jitter increases and the characteristic of the phase interpolation may be degraded.

Figure 4:
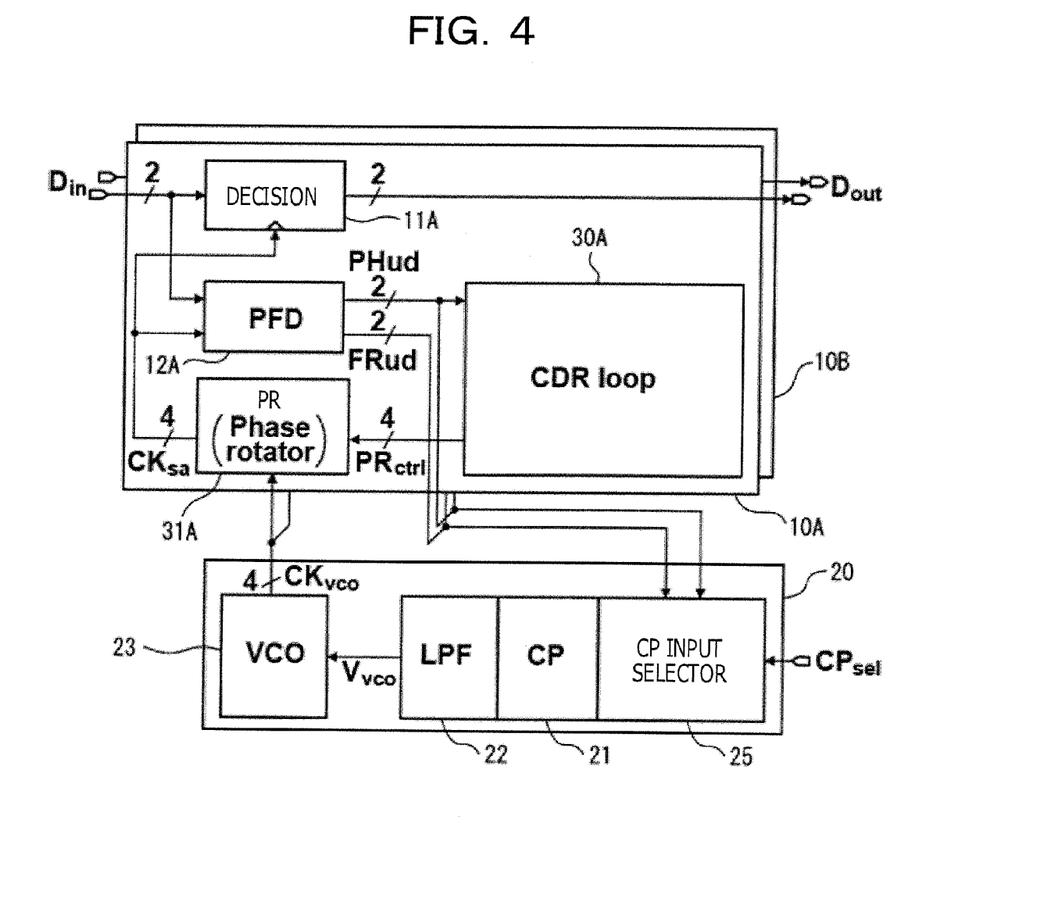
FIG. 4 is a view illustrating an example of a re-timer circuit of a multi-lane transmission system.

FIG. 4 is a view illustrating an example of a re-timer circuit of a multi-lane transmission system. In FIG. 4, a two-lane configuration is illustrated, but a three or more-lane configuration may also be employed and the configuration may be substantially the same as or similar to the configuration illustrated in FIG. 4.

The reception side includes a plurality of (e.g., two in FIG. 2) the reception circuits 10A and 10B and the clock generation circuit 20. One clock generation circuit 20 may be shared by the plurality of the reception circuits.

The reception circuit 10A includes the decision circuit 11A, the phase frequency detector 12A, a clock data recovery (CDR) loop 30A and a phase rotator (PR) 31A. The reception circuit 10B may also have a configuration which is substantially the same as or similar to that of the reception circuit 10A. The decision circuit 11A and the phase frequency detector 12A may also be substantially the same as or similar to those corresponding elements illustrated in FIG. 2 or FIG. 3.

The clock data recovery loop 30A may be a block which outputs $PR_{ctrl}$ controlling a phase of an output clock of the phase rotator 31A after filtering the phase difference signal sent from the phase frequency detector 12A, and may have any configuration. For example, the clock data recovery loop 30A may have an analog control configuration including the charge pump 13A, the loop filter 14A and the controller 16A illustrated in FIG. 2, or a digital control configuration including the digital filter 18A and the DAC 19A illustrated in FIG. 3.

The phase rotator 31A shifts the phase of the base clock which is output by the VCO 23 and may have any configuration. For example, the phase rotator 31A may shift the phase by interpolation as in the PI 17 illustrated in FIG. 2 or FIG. 3, or shift the phase by a delay.

As illustrated in FIG. 4, the phase frequency detector of each of the plurality of the reception circuits 10A and 10B sends the frequency difference signal $FR_{ud}$ and the phase difference signal $PH_{ud}$ to the clock generation circuit 20. For example, the clock generation circuit 20 receives a first set of the frequency difference signal $FR_{ud}$ and the phase difference signal $PH_{ud}$ from the phase frequency detector 12A of the reception circuit 10A, and a second set of the frequency difference signal $FR_{ud}$ and the phase difference signal $PH_{ud}$ from the phase frequency detector of the reception circuit 10B. For example, the clock generation circuit 20 receives the frequency difference signal and the phase difference signal output by the plurality of the phase frequency detectors of the plurality of the reception circuit.

The clock generation circuit 20 includes a charge pump input selector 25, the charge pump 21, the loop filter 22 and the VCO 23. For example, the loop filter 22 and the VCO 23 illustrated in FIG. 4 may employ a known configuration of the loop filter 14 and the VCO 15 illustrated in FIG. 1, or the loop filter 22 and the VCO 23 illustrated in FIG. 2 and FIG. 3.

The charge pump input selector 25 selects signal to be output to the charge pump 21 from a plurality of sets (here, two sets) of the frequency difference signal $FR_{ud}$ and the phase difference signal $PH_{ud}$ according to the charge pump input selection signal $CP_{sel}$ from outside. The charge pump input selection signal $CP_{sel}$ includes $CP_{off}$ which turns OFF all the signal, an individual selection signal which selects whether to input the plurality of sets of the frequency difference signal $FR_{ud}$ and the phase difference signal $PH_{ud}$ to the charge pump 21, and a gain adjustment signal for the corresponding portion of the charge pump 21 according to the selection. In FIG. 4, since two-lane configuration is employed, the individual selection signal includes $CP_{sel1}$ which selects the first set of the frequency difference signal $FR_{ud}$ and the phase difference signal $PH_{ud}$, and $CP_{sel2}$ which selects the second set of the frequency difference signal $FR_{ud}$ and the phase difference signal $PH_{ud}$.

Figure 5:
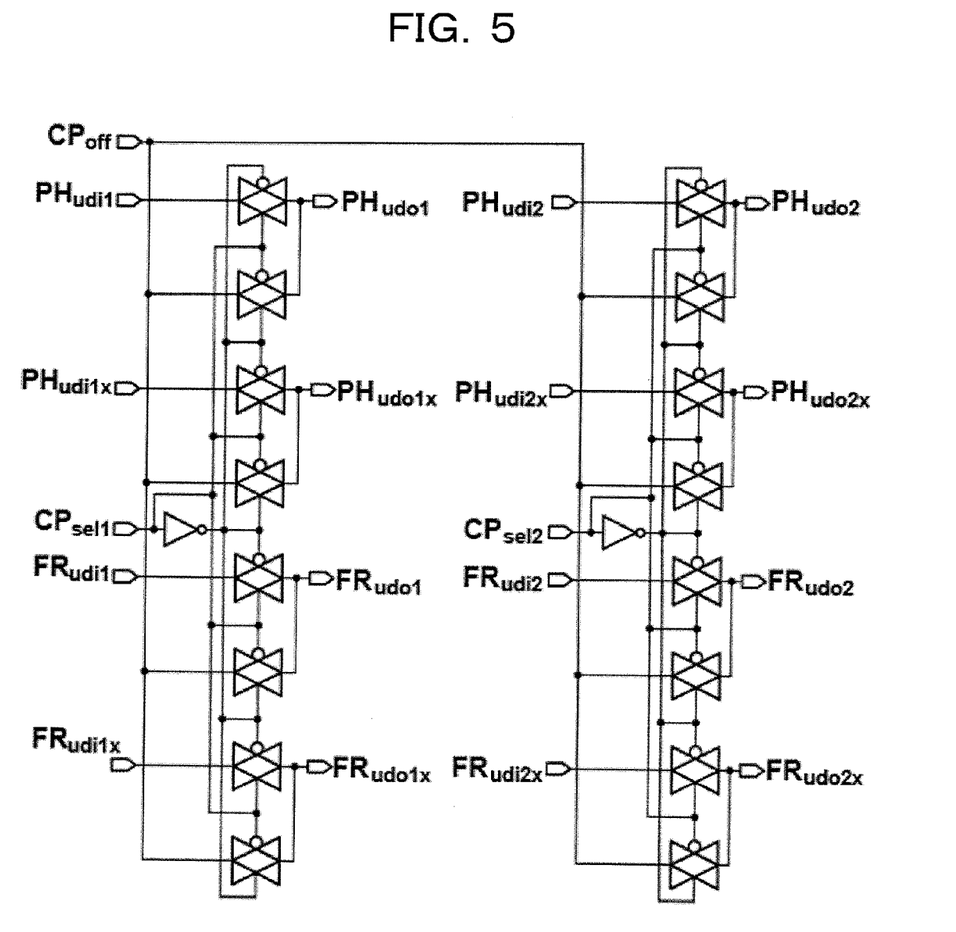
FIG. 5 is a view illustrating an example of a charge pump input selector.

FIG. 5 illustrates an example of a charge pump input selector. The charge pump input selector 25 includes a number of switches which amounts to the number of lanes×the number of signal (here, 2 (two))×the number of polarities (here, 2 (two)). Each switch is comprised of two transfer gates, and one of the transfer gates is controlled to be in a passing state and the other is controlled to be in a cutoff state based on the individual selection signal of each lane. For example, in FIG. 5, the number of lanes is two, the number of signal is two (phase difference signal and frequency difference signal) and the number of polarities is two, and the charge pump input selector 25 includes eight sets of the transfer gates, for example, sixteen transfer gates. The frequency difference signal $FR_{ud}$ or the phase difference signal $PH_{ud}$ is input to one of two transfer gates of each set and the $CP_{off}$ which is the signal level upon stopping is input to the other of two transfer gates of each set. The outputs of two transfer gates are coupled to each other and corresponding signal is output from a connection node of the outputs. Therefore, the switch of the transfer gate is switched in such a way that when the individual selection signal is ON, the frequency difference signal $FR_{ud}$ or the phase difference signal $PH_{ud}$ which is input is output as the corresponding signal, and when the individual selection signal is OFF, the $CP_{off}$ is output as the corresponding signal.

For example, in FIG. 5, during a normal operation, all the individual selection signals $CP_{sel1}$ and $CP_{sel2}$ are turned ON and all the frequency difference signal $FR_{ud}$ and the phase difference signal $PH_{ud}$ which are input are selected as the corresponding signal to be input to the CP 21.

For example, when a certain fault occurs at the first lane, the individual selection signal $CP_{sel1}$ is turned OFF and the $CP_{off}$ is input to the charge pump 21 as the first frequency difference signal $FR_{ud}$ and the first phase difference signal $PH_{ud}$. In this case, the individual selection signal $CP_{sel2}$ is maintained in an ON state, so that the second frequency difference signal $FR_{ud}$ and the second phase difference signal $PH_{ud}$ output by the phase frequency detector of the second reception circuit 10B are input to the charge pump 21. When a certain fault occurs at the second lane, the individual selection signal $CP_{sel2}$ is turned OFF and the $CP_{off}$ is input to the charge pump 21 as the second the frequency difference signal $FR_{ud}$ and the second phase difference signal $PH_{ud}$. In this case, the individual selection signal $CP_{sel2}$ is CP maintained in an ON state, so that the first frequency difference signal $FR_{ud}$ and the first phase difference signal $PH_{ud}$ output by the phase frequency detector 12A of the second reception circuit 10A are input to the charge pump 21. When both of the individual selection signals $CP_{sel1}$ and $CP_{sel2}$ are turned OFF, the $CP_{off}$ is input to the charge pump 21.

The gain adjustment signal indicates a gain of each signal. For example, in a case of two-lane configuration, when two individual selection signals are ON, both gain adjustment signals may be 0.5. When one individual selection signal is ON and the other is OFF, the gain adjustment signals may be 1 and 0.5, respectively, and when both individual selection signals are OFF, both gain adjustment signals may be 0. The gain adjustment signal may be set in such a way that a loop gain is not changed according to the number of signal to be input to the charge pump 21 and not changed according to the number of selected lanes. For example, when it is confirmed that a specific lane is failed, the gain adjustment signal is controlled so as not to allow the signal of the faulty lane to be input to the charge pump. The fault detection signal may be transmitted from a system side and the fault detection circuit may be used within the re-timer circuit.

Figure 6:
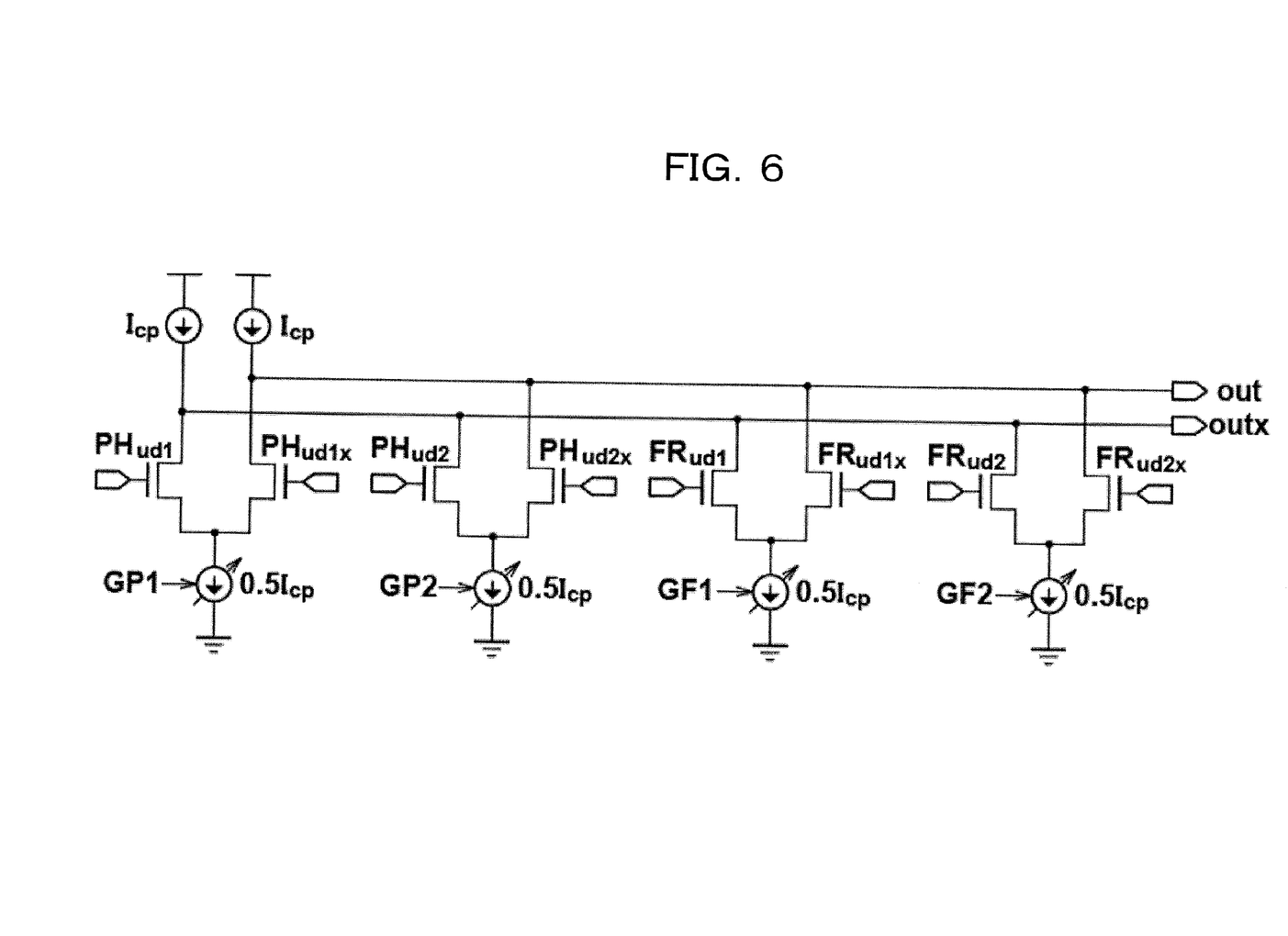
FIG. 6 is a view illustrating an example of a charge pump circuit in a clock generation circuit.

FIG. 6 is a view illustrating a charge pump circuit in a clock generation circuit. The charge pump 21 illustrated in FIG. 6 may be used in the clock generation circuit 20 illustrated in FIG. 2 to FIG. 4. The CP 21 includes four differential pairs. Two terminals of one of each of the differential pairs are coupled connected to ground through a variable current source, and each of the two terminals of the other of each of the differential pairs is coupled high voltage power supplies through a load, respectively. The differential signals of the phase difference signal $PH_{ud}$ and the frequency difference signal $FR_{ud}$ output by the two phase frequency detectors of two reception circuits are applied to the four differential pairs. An amount of electric current of four variable current sources is set by the gain adjustment signal GP1, GP2, GF1, or GF2 corresponding to the signal applied to each of the differential pairs. The differential output "out" and "outx" are output as the charge signal from a connection node of two terminals of the other of each of the differential pair and two loads.

The charge pump 21 of FIG. 6 may be a differential charge pump. The electric current of $2 I_{cp}$ is supplied from the power supply, and the electric current of $0.5 I_{cp}$ is discharged to each of the four differential pairs. For example, all the gain adjustment signals GP1, GP2, GF1 and GF2 may be substantially the same value. The electric current flowing in the differential pairs may be set in order not to be the same according to the two phase difference signal and the two frequency difference signal. For example, each of the electric currents flowing in the differential pair for two $FR_{ud}$ may be set $I_{cp}$. In this case, the amount of electric current to be supplied may be set to 3 $I_{cp}$ to balance the amount of electric current to be supplied and the amount of electric current to be discharged. The charge signal is generated by calculating a weighted average of pieces of signal. The amount of electric current of the differential pair of the frequency difference signal $FR_{ud}$ may influence on a pulling-in characteristic at an initial operation. For example, when the weight of the frequency difference signal is made larger, the pulling-in speed becomes faster upon rising. When the frequency difference signal reaches a certain frequency for a short period of time, the frequency difference is maintained in a state of being nearly zero, so that the charge signal may become a signal depending on a value obtained by averaging a plurality of the phase difference signal and the change thereof may become small.

When the phase difference signal and the frequency difference signal of a specific lane are not selected by the charge pump input selector 25, for example, when the signal is stopped, the signal level upon stopping, for example, the $CP_{off}$ illustrated in FIG. 5 is input to the differential pairs. In this configuration, the inputs of each differential pair are in a common mode level and 0.25 Icp is discharged equally from each of the differential outputs "out" and "outx", and the charge pump 21 may not actually operate. Since the number of lanes is changed from 2 (two) lanes to 1 (one) lane and thus gain becomes one half, $I_{cp}$ may be set to twice the value set in the two-lane configuration, or the electric current of the other differential pair may be set to twice the value set in the two-lane configuration due to the stopping of the electric current for the stopped differential pair.

Figure 7:
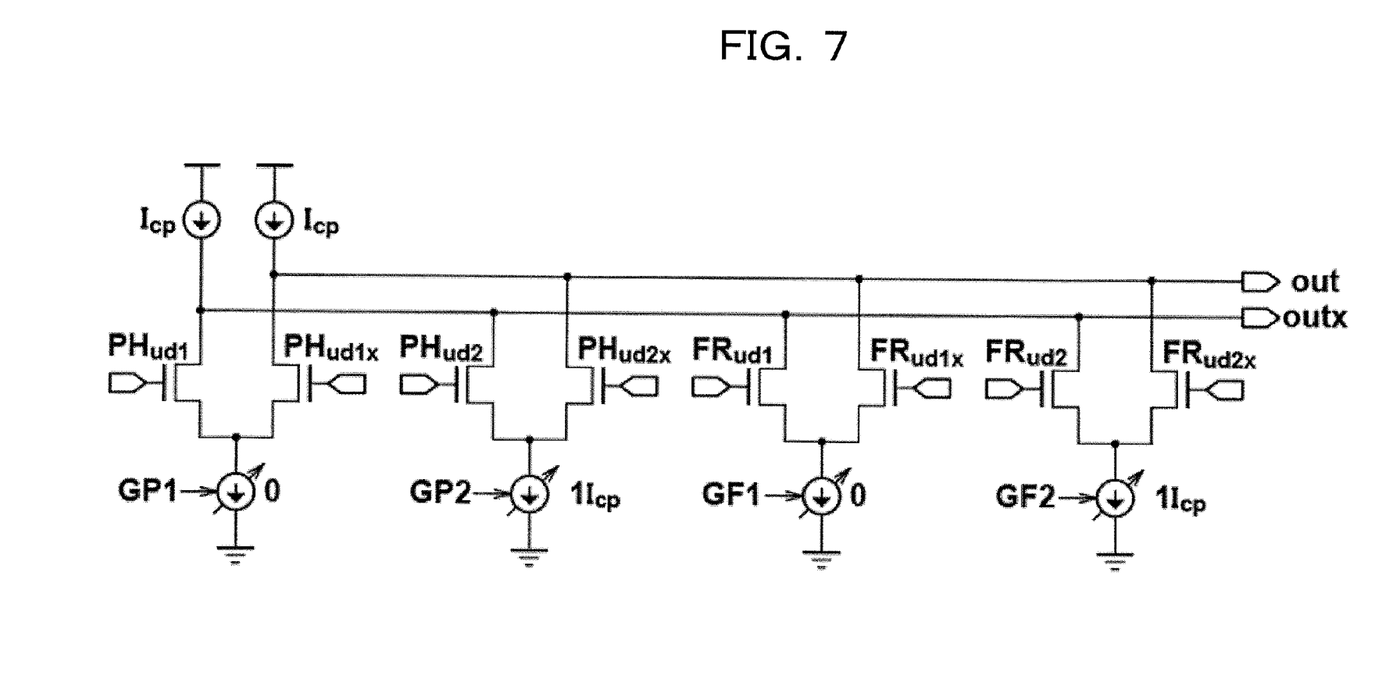
FIG. 7 is a view illustrating an example of a state of a charge pump.

FIG. 7 is a view illustrating an example of a state of a charge pump. In FIG. 7, in the charge pump 21 illustrated in FIG. 6, the phase difference signal $PH_{ud}$ and the frequency difference signal $FR_{ud}$ output by the phase frequency detector 12A of the reception circuit 10A are not selected (stopped), the variable current source of the corresponding differential pair is stopped, and the amount of electric current of the variable current source of the other differential pair value is set to be twice the value set in the two-lane configuration.

In the re-timer circuit of the reception side of the multi-lane transmission system illustrated in FIG. 4, the frequency difference signal and the phase difference signal are sent from the reception circuits of all the lanes to the clock generation circuit and these signal are switched. Therefore, when a specific lane is failed, a control in which the signal sent from the faulty lane is not utilized may be performed so as to reduce a situation where all the lanes are not operated. Even when the specific lane is failed, the other normal lanes may continuously operate.

Since the phase difference signal is used for controlling the oscillation frequency of the VCO of the clock generation circuit, the base clock $CK_{VCO}$ generated by the VCO may be controlled in order not to have a frequency offset with respect to the input data. The phase rotator of each lane operates to cancel the skew between lanes, a continuous performing of the phase shift at all times may be reduced, and a characteristic degradation by the phase interpolator may be reduced. A normal phase shift of the phase interpolator is reduced and jitter caused by the normal phase shift may be reduced and thus, a characteristic may be improved.

Figure 8:
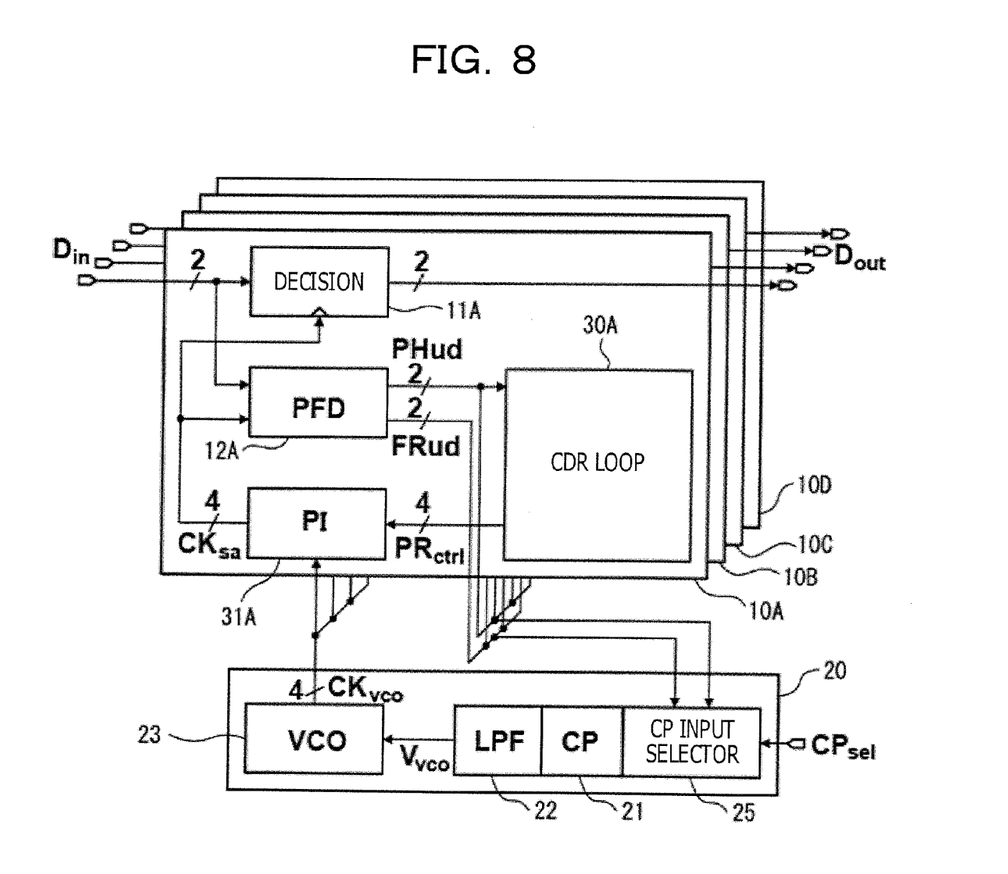
FIG. 8 is a view illustrating another example of a re-timer circuit of a multi-lane transmission system.

FIG. 8 is a view illustrating another example of a re-timer circuit of a multi-lane transmission system, and the number of lanes may be two or more. In FIG. 8, a four-lane configuration is illustrated. The phase difference signal and the frequency difference signal are input from the reception circuits 10A, 10B, 10C and 10D of all the lanes to the charge pump input selector 25 of the clock generation circuit 20. The charge pump input selector 25 illustrated in FIG. 8 may have a configuration in which the number of switches is twice of that in the configuration illustrated in FIG. 5. The charge pump 21 illustrated in FIG. 8 may have a configuration in which the number of differential pairs is twice of that in the configuration illustrated in FIG. 6.

Figure 9:
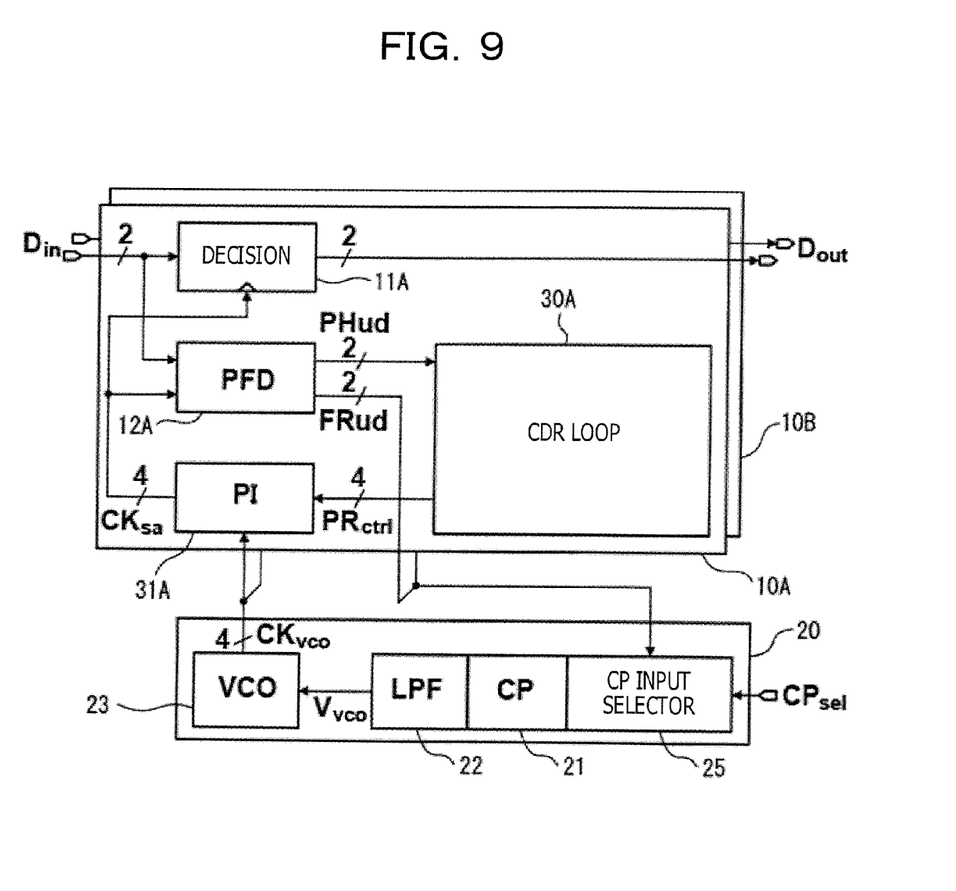
FIG. 9 is a view illustrating still another example of a re-timer circuit of a multi-lane transmission system.

FIG. 9 is a view illustrating still another example of a re-timer circuit of a multi-lane transmission system. In FIG. 4, a plurality of sets of the frequency difference signal and the phase difference signal are sent from the plurality of the reception circuits to the clock generation circuit.

As illustrated in FIG. 9, only the plurality of the frequency difference signal are sent from the plurality of the reception circuits to the clock generation circuit, but the phase difference signal are not sent to the clock generation circuit. The other configuration is substantially the same as or substantially similar to that illustrated in FIG. 4. The charge pump input selector 25 illustrated in FIG. 9 may have a configuration in which the number of switches is one half of that in the configuration illustrated in FIG. 5 except for the switch to which the differential signals of the phase difference signal are input. The charge pump 21 illustrated in FIG. 9 may have a configuration in which the number of differential pairs is one half of that in the configuration illustrated in FIG. 6 except for the differential pair to which the differential signals of the phase difference signal are input.

Figure 10:
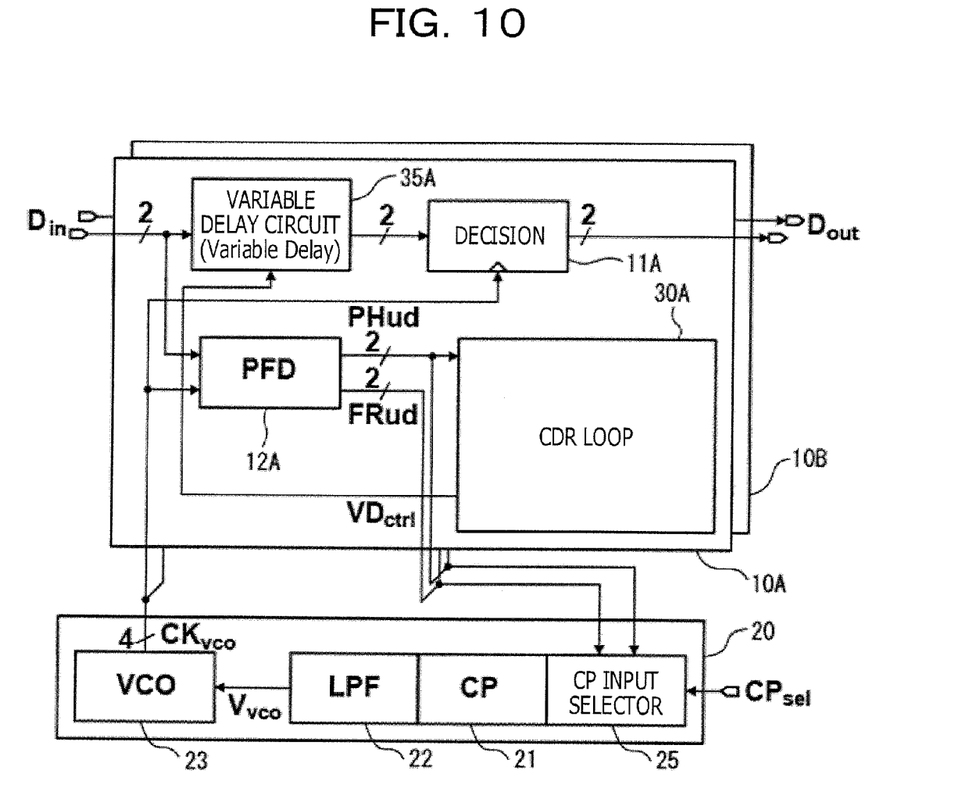
FIG. 10 is a view illustrating still yet another example of a re-timer circuit of a multi-lane transmission system.

FIG. 10 is a view illustrating still yet another example of a re-timer circuit of a multi-lane transmission system. The re-timer circuit illustrated in FIG. 10 is different from that illustrated in FIG. 4 in that the PR 31A is removed and the variable delay circuit 35A is used. Since the PR 31A is removed, the PFD 12A detects the phase difference and the frequency difference between the input data signal $D_{in}$ and the base clock $CK_{VCO}$ output by the VCO 23. The other configuration may be substantially the same as or substantially similar to that illustrated in FIG. 4.

The re-timer circuit illustrated in FIG. 4 shifts the clock phase to be synchronized with the input data. The re-timer circuit as illustrated in FIG. 10 delays the input data to synchronize the input data and the base clock output by the VCO. The decision circuit 11A receives the input data using the synchronized base clock. For example, the base clock may be used as a reception clock. A delay amount of the variable delay circuit 35A is controlled by a control signal $VD_{ctrl}$ output by the CDR loop 30A. Similarly as in FIG. 4, in FIG. 10, since the phase difference signal is used for controlling the oscillation frequency of the VCO 23 of the clock generation circuit 20, the base clock $CK_{VCO}$ generated by the VCO may be controlled in order not to have the frequency offset with respect to the input data. Therefore, the phase rotator of each lane mainly operates to cancel the skew between the lanes, and the continuous performing of the phase shift at all times may be reduced. In FIG. 10, the delay amount by the variable delay circuit 35A becomes stable and the input data may be accurately received.

Figure 11:
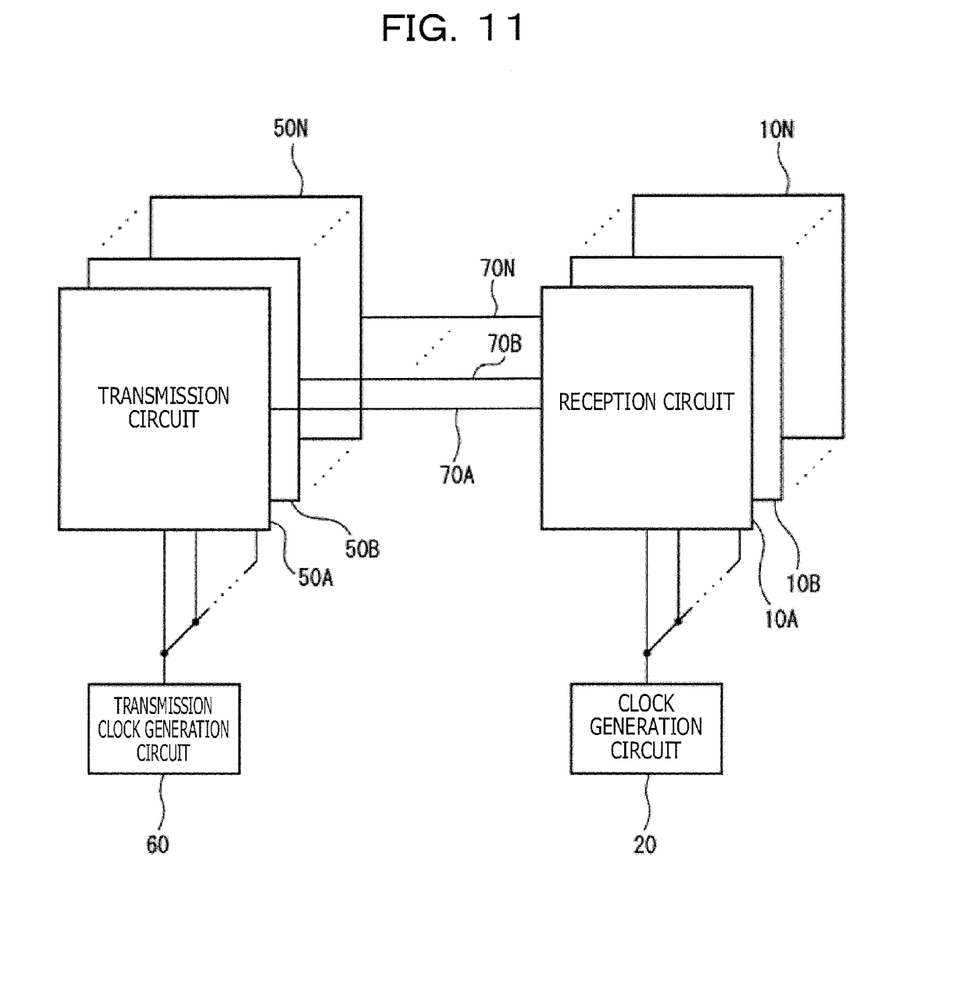
FIG. 11 is a view illustrating an example of a multi-lane transmission system.

FIG. 11 is a view illustrating an example of a multi-lane transmission system. The multi-lane transmission system illustrated in FIG. 11 includes N transmission lanes 70A to 70N, N transmission circuits 50A to 50N, a transmission clock generation circuit 60, N reception circuits 10A to 10N, and a reception clock generation circuit 20. The transmission circuits 50A to 50N output data to the transmission lanes 70A to 70N by synchronizing the data to the transmission clock from the transmission clock generation circuit 60. In the reception circuits 10A to 10N and the clock generation circuit 20, the re-timer circuit described above may be expanded so as to be used for a N-transmission lane configuration.

The clock signal may have four or more phases, and an interleaved configuration may be employed in which a clock signal having eight phases or sixteen phases is used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:
1. A multi-lane re-timer circuit comprising:
a clock generation circuit configured to generate a base clock; and
a plurality of reception circuits configured to generate a reception clock based on the base clock and receive input data signals from a plurality of lanes according to the reception clock,
wherein each of the plurality of the reception circuits includes:
a phase frequency detector configured to detect a phase difference and a frequency difference between the input data signal and the reception clock, and generate a phase difference signal and a frequency difference signal;
a clock data regeneration controller configured to generate a control signal based on the phase difference signal;
a phase rotator configured to generate the reception clock from the base clock according to the control signal; and
a decision circuit configured to receive the input data signal according to the reception clock, and
wherein the clock generation circuit includes:
an input selector configured to receive a first selection signal and a second selection signal, select, based on the first selection signal and the second selection signal, as a signal to be used all of pieces of the frequency difference signal output by phase frequency detectors of the plurality of the reception circuits and select, based on the second selection signal, as the signal to be used a part of the pieces of the frequency difference signal;
a charge pump configured to generate a charge signal according to a selection result selected by the input selector;
a loop filter configured to remove a high frequency component from the charge signal to output a voltage control signal; and
a voltage controlled oscillator configured to generate the base clock according to the voltage control signal.
2. The multi-lane re-timer circuit according to claim 1, wherein the input selector is configured to have a state where all of the pieces of the frequency difference signal output by the phase frequency detectors of the plurality of reception circuits are selected.

3. The multi-lane re-timer circuit according to claim 1, wherein the input selector is configured to select the signal to be used from pieces of the phase difference signal output by the phase frequency detectors of the plurality of the reception circuits along with the pieces of the frequency difference signal, the charge pump is configured to generate the charge signal according to the pieces of the frequency difference signal and the pieces of the phase difference signal selected by the input selector.

4. The multi-lane re-timer circuit according to claim 3, wherein the input selector is configured to have a state where all of the pieces of frequency difference signal and all of the pieces of phase difference signal are selected and a state where some of the pieces of frequency difference signal and some of the pieces of phase difference signal are selected, and the charge pump is configured to adjust gains of the frequency difference signal and the phase difference signal selected when the charge signal is generated, according to a number of the frequency difference signal selected by the input selector.

5. A multi-lane reception system comprising:
a reception side configured to receive input data through a plurality of transmission lanes from a transmission side which outputs data to the plurality of transmission lanes according to a common transmission clock,
wherein the reception side includes:
a plurality of reception circuits used to be corresponded with the plurality of transmission lanes respectively, and
each of the plurality of reception circuits includes:
a phase frequency detector configured to detect a phase difference and a frequency difference between the input data signal and the reception clock, and generate a phase difference signal and a frequency difference signal;
a clock data regeneration controller configured to generate a control signal based on the phase difference signal; and
a decision circuit configured to receive the input data signal based on the control signal and the reception clock, and the reception clock is generated based on the frequency difference signal selected from pieces of the frequency difference signal output by the phase frequency detectors of the plurality of reception circuits, a selection of the frequency difference signal being performed so as to receive a first selection signal and a second selection signal from an outside, select, based on the first selection signal and the second selection signal, as a signal to be used all of the pieces of the frequency difference signal and select, based on the second selection signal, as the signal to be used a part of the pieces of the frequency difference signal.

6. The multi-lane reception system according to claim 5, further comprising a phase rotator configured to generate the reception clock from the base clock according to the control signal.

7. The multi-lane reception system according to claim 5, further comprising a variable delay circuit configured to delay the input data signal according to the control signal,
wherein the decision circuit is configured to receive the delayed input data signal according to the reception clock.

8. The multi-lane reception system according to claim 5, further comprising:
a charge pump configured to generate a charge signal according to a selection result;
a loop filter configured to remove the high frequency component from the charge signal to output a voltage control signal; and
a voltage controlled oscillator configured to generate the reception clock according to the voltage control signal.

* * * * *